United States Patent
Lee et al.

(10) Patent No.: US 10,079,156 B2
(45) Date of Patent: Sep. 18, 2018

(54) SEMICONDUCTOR PACKAGE INCLUDING DIELECTRIC LAYERS DEFINING VIA HOLES EXTENDING TO COMPONENT PADS

(71) Applicant: ADVANCED SEMICONDUCTOR ENGINEERING, INC., Kaosiung (TW)

(72) Inventors: Chih-Cheng Lee, Kaohsiung (TW);
Yuan-Chang Su, Kaohsiung (TW);
Yu-Lin Shih, Kaohsiung (TW);
You-Lung Yen, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days.

(21) Appl. No.: 14/703,794

(22) Filed: May 4, 2015

(65) Prior Publication Data
US 2016/0133562 A1   May 12, 2016

Related U.S. Application Data

(63) Continuation-in-part of application No. 14/536,253, filed on Nov. 7, 2014, now Pat. No. 9,721,799.

(51) Int. Cl.
*H01L 21/48*   (2006.01)
*H01L 23/31*   (2006.01)
(Continued)

(52) U.S. Cl.
CPC ........ *H01L 21/481* (2013.01); *H01L 23/3121* (2013.01); *H01L 23/49822* (2013.01);
(Continued)

(58) Field of Classification Search
None
See application file for complete search history.

(56) References Cited

U.S. PATENT DOCUMENTS 5,204,286 A * 4/1993 Doan ................ H01L 21/76805
148/DIG. 50
5,250,843 A   10/1993 Eichelberger
(Continued)

FOREIGN PATENT DOCUMENTS

CN        1640216 A    7/2005
CN     101542507 A    9/2009
(Continued)

OTHER PUBLICATIONS

Machine translation of KR2001-0061784 has been attached.*
(Continued)

*Primary Examiner* — Bilkis Jahan
(74) *Attorney, Agent, or Firm* — Foley & Lardner LLP; Cliff Z. Liu

(57) ABSTRACT

The present disclosure relates to a semiconductor package and method of making the same. The semiconductor package includes an encapsulation layer, a component within the encapsulation layer, a first dielectric layer, a second dielectric layer, a first patterned conductive layer, and a second patterned conductive layer. The component includes pads on a front surface of the component. The first dielectric layer is disposed on a surface of the encapsulation layer. The second dielectric layer is disposed on a surface of the first dielectric layer. The first and second dielectric layers define via holes extending from the second dielectric layer to respective ones of the pads. The first patterned conductive layer is disposed within the first dielectric layer and surrounds the via holes. The second patterned conductive layer is disposed within the second dielectric layer and surrounds the via holes.

16 Claims, 11 Drawing Sheets

(51) Int. Cl.
  *H01L 23/00* (2006.01)
  *H01L 23/498* (2006.01)
  *H01L 23/538* (2006.01)
  *H01L 21/56* (2006.01)

(52) U.S. Cl.
  CPC .... *H01L 23/49827* (2013.01); *H01L 23/5389* (2013.01); *H01L 24/19* (2013.01); *H01L 24/20* (2013.01); *H01L 21/568* (2013.01); *H01L 2224/04105* (2013.01); *H01L 2224/92144* (2013.01)

(56) References Cited

U.S. PATENT DOCUMENTS

| | | | |
|---|---|---|---|
| 6,133,079 A * | 10/2000 | Zhu | H01L 23/5227 257/E21.022 |
| 6,261,937 B1 * | 7/2001 | Tobben | H01L 21/76888 257/E21.592 |
| 6,423,570 B1 | 7/2002 | Ma et al. | |
| 6,555,906 B2 * | 4/2003 | Towle | H01L 21/568 257/701 |
| 6,680,529 B2 | 1/2004 | Chen et al. | |
| 6,909,054 B2 | 6/2005 | Sakamoto et al. | |
| 6,914,322 B2 | 7/2005 | Iijima et al. | |
| 7,005,327 B2 | 2/2006 | Kung et al. | |
| 7,285,862 B2 | 10/2007 | Sunohara et al. | |
| 7,498,200 B2 | 3/2009 | Sunohara et al. | |
| 7,663,215 B2 | 2/2010 | Tuominen et al. | |
| 7,732,712 B2 | 6/2010 | Yamano | |
| 9,646,851 B2 * | 5/2017 | Sankman | H01L 21/4853 |
| 2003/0156402 A1 | 8/2003 | Ding et al. | |
| 2005/0127492 A1 | 6/2005 | Howard et al. | |
| 2005/0155792 A1 | 7/2005 | Ito et al. | |
| 2006/0197216 A1 | 9/2006 | Yee | |
| 2008/0036050 A1 * | 2/2008 | Lin | H01L 21/50 257/659 |
| 2008/0150159 A1 * | 6/2008 | Aberin | H01L 21/563 257/778 |
| 2008/0185582 A1 | 8/2008 | Middlekauff et al. | |
| 2009/0075428 A1 * | 3/2009 | Tang | H01L 21/561 438/114 |
| 2009/0215231 A1 | 8/2009 | Inoue | |
| 2010/0013087 A1 | 1/2010 | England | |
| 2011/0089572 A1 * | 4/2011 | Tezcan | H01L 21/76898 257/774 |
| 2012/0074580 A1 * | 3/2012 | Nalla | H01L 21/568 257/774 |
| 2012/0086122 A1 | 4/2012 | Cheng et al. | |
| 2013/0075890 A1 | 3/2013 | Gallegos et al. | |
| 2013/0127043 A1 | 5/2013 | Poddar et al. | |
| 2013/0200525 A1 | 8/2013 | Lee et al. | |
| 2014/0103508 A1 | 4/2014 | Herbsommer | |
| 2014/0197505 A1 | 7/2014 | Zhou et al. | |

FOREIGN PATENT DOCUMENTS

| | | | |
|---|---|---|---|
| CN | 102099911 A | 6/2011 | |
| CN | 102214624 A | 10/2011 | |
| CN | 103021982 A | 4/2013 | |
| CN | 103247600 A | 8/2013 | |
| CN | 103730427 A | 4/2014 | |
| CN | 103918074 A | 7/2014 | |
| KR | 20010061784 | * 7/2001 | ............ H01L 23/04 |

OTHER PUBLICATIONS

Non-Final Office Action received for U.S. Appl. No. 14/536,253 dated Dec. 3, 2015, 12 pages.
U.S. Office Action on U.S. Appl. No. 14/536,253 dated Jun. 3, 2016.
Non-Final Office Action for U.S. Appl. No. 14/536,253, dated Nov. 8, 2016.
Office Action for Chinese Patent Application No. 201510145566.8 dated Apr. 4, 2018, 8 pages.
Search Report for corresponding Chinese Patent Application No. 201510145566.8, issued with Office Action dated Apr. 4, 2018, 5 pages.

* cited by examiner

SEMICONDUCTOR PACKAGE INCLUDING DIELECTRIC LAYERS DEFINING VIA HOLES EXTENDING TO COMPONENT PADS

CROSS REFERENCE TO RELATED APPLICATIONS

This application is a continuation-in-part of U.S. patent application Ser. No. 14/536,253, filed on Nov. 7, 2014, the contents of which are incorporated by reference herein in their entirety.

BACKGROUND

1, Technical Field

The present disclosure relates to a semiconductor package and a manufacturing method thereof, and more particularly to a semiconductor package with an embedded component and a method of manufacturing the same.

2, Description of the Related Art

Semiconductor devices have become progressively more complex, driven at least in part by the demand for smaller sizes and enhanced processing speeds. At the same time, there is a demand to further miniaturize many electronic products that include these semiconductor devices. Semiconductor devices are typically packaged, and then may be installed on a substrate including electrical circuitry, such as a circuit board. This results in space being occupied within an electronic product by both the semiconductor device package and the substrate, and in a surface area on the substrate being occupied by the semiconductor device package. In addition, cost may be incurred by performing packaging, board manufacturing, and assembly as separate processes. It would be desirable to reduce the space occupied by the semiconductor device and the substrate, and to simplify and combine the packaging, board manufacturing, and assembly processes as applied to the semiconductor device and the substrate.

SUMMARY

In accordance with an embodiment of the present disclosure, a semiconductor package includes an encapsulation layer, a component within the encapsulation layer, a first dielectric layer, a second dielectric layer, a first patterned conductive layer, and a second patterned conductive layer. The encapsulation layer has a first surface. The component has a front surface and includes pads on the front surface. The first dielectric layer is disposed on the first surface of the encapsulation layer and has a second surface facing away from the first surface of the encapsulation layer. The second dielectric layer is disposed on the second surface of the first dielectric layer and has a third surface facing away from the second surface of the first dielectric layer. The first and second dielectric layers define first via holes extending from the third surface of the second dielectric layer to respective ones of the pads. The first patterned conductive layer is disposed within the first dielectric layer and surrounds the first via holes. The second patterned conductive layer is disposed within the second dielectric layer and surrounds the first via holes.

In accordance with another embodiment of the present disclosure, a semiconductor package includes a die, an encapsulation layer, a first dielectric layer, a second dielectric layer, first conductive members, a first patterned conductive layer, and a second patterned conductive layer. The die includes a die body and pads, wherein the die body has a front surface on which the pads are disposed. The encapsulation layer has a first surface and encapsulates the die body while exposing the front surface of the die body from the first surface of the encapsulation layer. The first dielectric layer is disposed on the first surface of the encapsulation layer and directly covers the pads, wherein the first dielectric layer has a second surface facing away from the first surface of the encapsulation layer. The second dielectric layer is disposed on the second surface of the first dielectric layer, and has a third surface facing away from the second surface of the first dielectric layer. The first conductive members penetrate the first and second dielectric layers and are electrically connected to respective ones of the pads. The first patterned conductive layer is embedded in the first dielectric layer. The second patterned conductive layer is embedded in the second dielectric layer. The first and second patterned conductive layers are electrically connected to the first conductive members.

In accordance with a further embodiment of the present disclosure, a method of making semiconductor package includes: (a) providing a carrier having an upper surface; (b) forming a first patterned conductive layer on the upper surface of the carrier; (c) forming a first dielectric layer encapsulating the first patterned conductive layer, wherein the first dielectric layer has a first surface facing away from the upper surface of the carrier; (d) forming a second patterned conductive layer on the first surface of the first dielectric layer; (e) forming a second dielectric layer encapsulating the second patterned conductive layer, wherein the second dielectric layer has a second surface facing away from the first surface of the first dielectric layer; (f) attaching a die comprising pads to the second surface of the second dielectric layer; (g) forming an encapsulation layer encapsulating the die; (h) removing the carrier; (i) forming first conductive via holes penetrating the first dielectric layer and the second dielectric layer; and (j) forming, in the first conductive via holes, conductive members electrically connecting the pads to one or both of the first patterned conductive layer and the second patterned conductive layer.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

Substrates having semiconductor devices embedded (e.g., chip-embedded substrates) may include a semiconductor device or a chip first buried in a substrate, and a rerouting structure fabricated in subsequent processes. The rerouting structure may include a redistribution layer (RDL) and interconnects (e.g., conducting posts) extending from the RDL and terminating as contact structures at the surface of a thick support layer used for the next level packaging structure. The RDL may be supported by a passivation layer formed over the embedded semiconductor device. A polymeric layer may be deposited over the RDL, and etched or drilled to provide a via hole for over-filling with a metal to form an interconnect (i.e., a conducting post) that extends above and beyond the opening of the via hole. A solder bump attached to a protruding end of the post may be formed, for example, by electroless plating, screen or stencil printing.

A top surface of the passivation layer may not be smooth, due to input/output (I/O) pads of the embedded semiconductor device extending beyond the surface of the semiconductor device. As a result, it may not be possible to use high-resolution lithography to form the via holes and the RDL. Consequently, a pitch (i.e., line-to-line space) and a minimum width of traces in the RDL would be limited. Moreover, if an RDL is formed incorrectly, the result may be a loss of a packaged substrate in which a relatively high cost semiconductor device is embedded.

To overcome these challenges, a semiconductor package and method of making the same is described in this disclosure, in which high-resolution techniques may be used to reduce via hole width, reduce pad pitch, improve yield, enhance the flexibility of circuit design, and reduce manufacturing cost.

Figure 1:
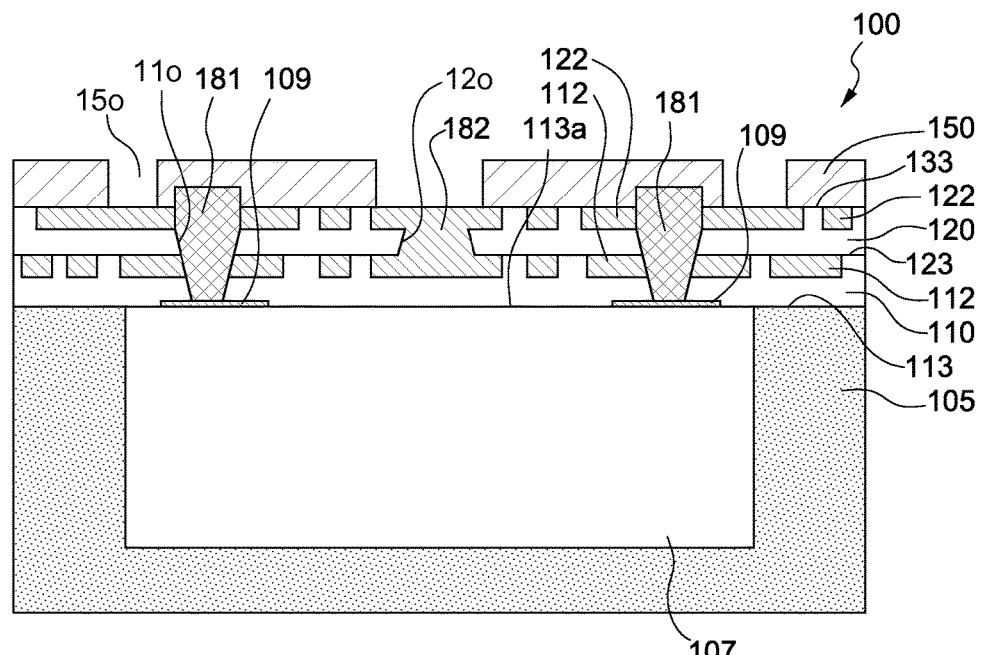
FIG. 1 illustrates a cross-sectional view of a semiconductor package in accordance with an embodiment of the present disclosure.

FIG. 1 illustrates a cross-sectional view of a semiconductor package 100 in accordance with an embodiment of the present disclosure. The semiconductor package 100 includes an encapsulation layer 105, a component 107 within the encapsulation layer 105, a first dielectric layer 110, a second dielectric layer 120, a first patterned conductive layer 112, and a second patterned conductive layer 122. The first and second patterned conductive layers 112 and 122 may be, but are not limited to, redistribution layers.

The encapsulation layer 105 has a surface 113. The encapsulation layer 105 may include, but is not limited to, a molding compound or pre-impregnated composite fibers (e.g., pre-preg). Examples of a molding compound may include, but are not limited to, an epoxy resin or an epoxy resin having fillers dispersed therein. A non-limiting example of a pre-preg is a multi-layer structure formed by stacking or laminating a number of pre-impregnated materials or sheets.

The component 107 has a front surface 113a and includes pads 109 on the front surface 113a. In an embodiment, the component 107 is a die including a die body and pads disposed on the front surface 113a of the die body. The component 107 may be buried or encapsulated in the encapsulation layer 105, and the front surface 113a of the component 107 and the pads 109 are exposed from the surface 113 of the encapsulation layer 105. In an embodiment, the front surface 113a of the component 107 may be coplanar with the surface 113 of the encapsulation layer 105.

The first dielectric layer 110 is disposed on the surface 113 of the encapsulation layer 105. The first dielectric layer 110 covers the front surface 113a of the component 107 and the pads 109. Each of the pads 109 has a portion that is not covered by the first dielectric layer, and that forms a bottom of a first via hole 11o. The first dielectric layer 110 has a surface 123 facing away from the surface 113 of the encapsulation layer 105. The component 107 is embedded between the encapsulation layer 105 and first dielectric layer 110 such that the pads 109 are embedded or encapsulated in the first dielectric layer 110. In an embodiment of the present disclosure, there is no additional layer disposed on the pad 109 such that the pad 109 is directly covered by the first dielectric layer, as illustrated in FIG. 1. In another embodiment of the present disclosure, there may be an additional layer, such as a passivation layer, disposed on the pad 109.

The second dielectric layer 120 is disposed on the surface 123 of the first dielectric layer 110, and has a surface 133 facing away from the surface 123 of the first dielectric layer 110. The first via holes 11o extend from the surface 133 of the second dielectric layer 120 to a respective one of the pads 109.

The first and second dielectric layers 110, 120, respectively, of the present disclosure can be formed by using any suitable dielectric material, such as polyimide (PI), benzocyclobutene (BCB), pre-impregnated composite fibers (prepreg) or other dielectric resin having similar properties, and the first and second dielectric layers 110, 120, respectively, may be disposed in the form of a coating composition or a film. In an embodiment of the present disclosure, the first and second dielectric layers 110, 120 are formed by applying or laminating a film of a dielectric resin, for example, an epoxy resin, and then curing the resin.

The first patterned conductive layer 112 is disposed in (e.g., embedded in) the first dielectric layer 110 adjacent to the surface 123. A portion of the first patterned conductive layer 112 surrounds the first via holes 110. The second patterned conductive layer 122 is disposed in (e.g., embedded in) the second dielectric layer 120 adjacent to the surface 133. A portion of the second patterned conductive layer 122 surrounds the first via holes 11o. The first and second patterned conductive layers 112 and 122, respectively, are made of a conductive material, which may be, but is not limited to, copper (Cu) or other metal, or a metal alloy. Because each of the first and second patterned conductive layers 112 and 122 is disposed in a respective dielectric layer, a minimum line width of approximately 2 µm (or less) and a minimum pitch of approximately 2 µm (or less) may be achieved.

In an embodiment of the present disclosure, each of the first via holes 11o is surrounded by the first patterned conductive layer 112 within the first dielectric layer 110 and also the second patterned conductive layer 122 within the second dielectric layer 120. The portion of the first patterned conductive layer 112 and the portion of the second patterned conductive layer 122 surrounding the first via hole 11o each form an annular or ring-shaped structure (e.g., a conductive ring) having an opening aligned to the first via hole 11o. As shown in FIG. 1, the bottom of the first via hole is formed by pad 109; a side wall of the first via hole 11o is formed by lateral surfaces of the first dielectric layer 110, the second dielectric layer 120, the ring-shaped structure of the first patterned conductive layer 112 and the ring-shaped structure of the second patterned conductive layer 122. For each of the first via holes 11o, an inner diameter of the ring-shaped portion of the first patterned conductive layer 112 is equal to or smaller than an inner diameter of the ring-shaped portion of the second patterned conductive layer 122.

Since the first via hole 11o connects the pad 109 on the component 107 and is surrounded by the ring-shaped structure of the first patterned conductive layer 112 and the ring-shaped structure of the second patterned conductive layer 122, the alignment between the via hole 110 and a respective one of the pads 109 can be improved, and fine pitch can be achieved in each of the first and second patterned conductive layers 112, 122, respectively. In addition, by using two conductive layers (i.e., the first patterned conductive layer 112 and the second patterned conductive layer 122), increased numbers of I/O connections are possible (e.g., without increasing a package size), and circuit design can be more flexible.

In an embodiment of the present disclosure, the second dielectric layer 120 defines second via holes 12o extending from the second patterned conductive layer 122 to the first patterned conductive layer 112. Lateral surfaces of the second dielectric layer 120 form side walls of the second via holes 12o The first patterned conductive layer 112 and the second patterned conductive layer 122 respectively form the top and bottom of the second via holes 12o. At least a portion of the first via holes 110 and the second via holes 12o are tapered. In this respect, tapered refers to a decrease in width, which can be gradual or stepwise, for example. As illustrated for the embodiment of FIG. 1, a portion of each of the first via holes 110 is tapered, while substantially the entireties of the second via holes 12o are tapered. In the embodiment of FIG. 1, the tapered portions of the first via holes 11o taper in an opposite direction from the taper of the second via holes 12o; in other embodiments, portions of the first via holes 110 and the second via holes 12o taper in the same direction, which may be top to bottom in the orientation shown, or bottom to top in the orientation shown. Further, in the embodiment of FIG. 1, the portions of the first via holes 11o taper from top to bottom in the orientation shown, whereas the second via holes 12o taper from bottom to top in the orientation shown; in other embodiments, the second via holes 12o taper from top to bottom in the orientation shown, and the portions of the first via holes 110 taper from bottom to top in the orientation shown.

The first via holes 110 are filled with first conductive members (or vias) 181. Each of the first conductive members 181 penetrates the first and second dielectric layers 110 and 120 and provides electrical connection among the first and second patterned conductive layers 112 and 122, respectively, and the pad 109. The first conductive members 181 may protrude from the surface 133 of the second dielectric layer 120. The first conductive members 181 may be formed by any suitable conductive material, such as, for example, a solder material (e.g., including tin (Sn) or a tin alloy, such as a tin alloy including lead or silver), a metal paste or a plating metal (e.g., Cu).

The second via holes 12o are filled with second conductive members (or vias) 182. Each of the second conductive members 182 penetrates the second dielectric layer 120 and provides electrical connection between the first and second patterned conductive layers 112, 122, respectively. The second conductive members 182 can be made by using the same material for preparing the first patterned conductive layer 112 or the second patterned conductive layer 122. Alternatively, the second conductive members 182 may be formed of a different material than either the first patterned conductive layer 112 or the second patterned conductive layer 122.

The first conductive members 181 have substantially the same shape as the first via holes 11o, and the second conductive members 182 have substantially the same shape as the second via holes 12o. In other words, the tapers of the first via holes 11o and the second via holes 12o are the same as the tapers of the respective first conductive members 181 and the second conductive members 182.

As described above, the first via holes 11o are surrounded by the ring-shaped structures of the first patterned conductive layer 112 and the ring-shaped structures of the second patterned conductive layer 122; thus, the first conductive members 181 are also surrounded by the ring-shaped structures of the first patterned conductive layer 112 and the ring-shaped structures of the second patterned conductive layer 122.

In an embodiment of the present disclosure, a protection layer 150 may be disposed on the surface 133 of the second dielectric layer 120. The protection layer 150 covers the second dielectric layer 120 and the second patterned conductive layer 122, and has openings 15o exposing a portion of the second patterned conductive layer 122. The exposed portion can be used as I/O contact(s) so as to electrically connect to an external circuit element (not shown). The protection layer 150 may be made of, for example, a solder resist layer, or a resin having a function of a solder resist layer.

In an embodiment, the semiconductor package 100 according to the present disclosure may include additional (i.e., more than two) patterned conductive layers.

Figure 2:
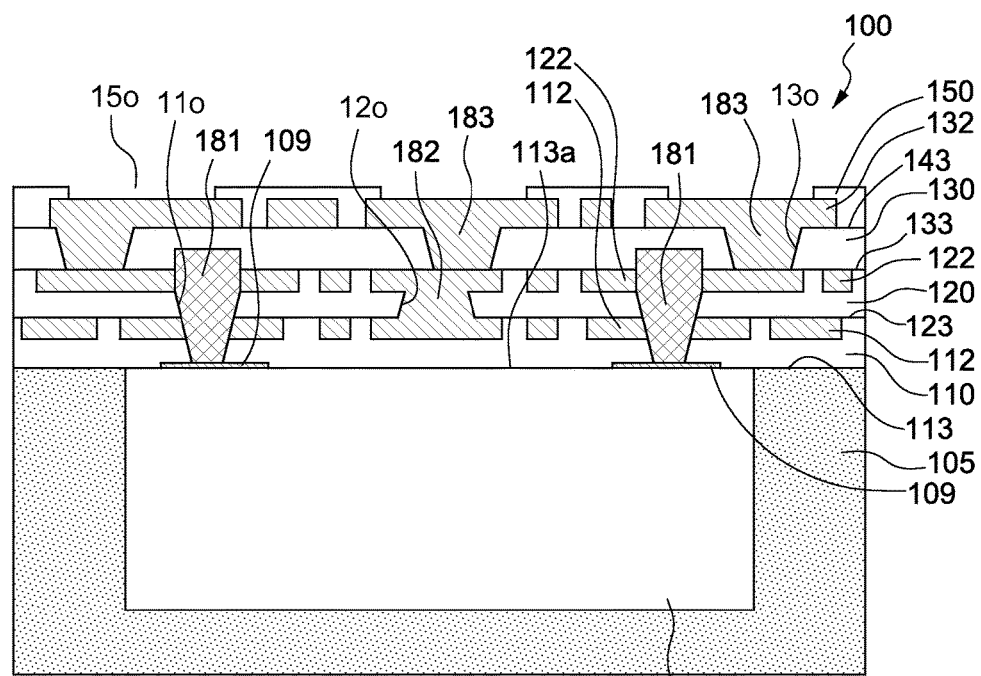
FIG. 2 illustrates a cross-sectional view of a semiconductor package in accordance with another embodiment of the present disclosure.

FIG. 2 illustrates a cross-sectional view of the semiconductor package 100 that includes three patterned conductive layers in accordance with an embodiment of the present disclosure.

As shown in FIG. 2, the semiconductor package 100 further includes a third dielectric layer 130 and a third patterned conductive layer 132. The third dielectric layer 130 is disposed on the surface 133 of the second dielectric layer 120 and has a surface 143 facing away from the surface 133 of the second dielectric layer 120. The third patterned conductive layer 132 is disposed on the surface 143 of the third dielectric layer 130.

The third dielectric layer 130 defines third via holes 13o extending from the third patterned conductive layer 132 to the second patterned conductive layer 122. The third via holes 13o are filled with third conductive members (or vias) 183. Each of the third conductive members 183 penetrates the third dielectric layer 130 and provides electrical connection between the second and third patterned conductive layers 122 and 132, respectively. In an embodiment of the present disclosure, the third patterned conductive layer 132 may be formed of copper or other suitable conductive material. The third conductive members 183 can be made of the same material as the third patterned conductive layer 132, or from a different conductive material.

A protection layer 150 may be disposed on the surface 143 of the third dielectric layer 130, and cover the third dielectric layer 130 and the third patterned conductive layer 132. The protection layer 150 defines openings 15o exposing a portion of the third patterned conductive layer 132. The exposed portion can be used as I/O contacts to electrically connect to an external circuit element (not shown).

As shown for the embodiment of FIG. 2, portions of the first via holes 11o, the second via holes 12o and the third via holes 13o are tapered, where the portions of the first via holes 11o taper in the same direction as the third via holes 13o, and the second via holes 12o taper in an opposite direction. According to embodiments of the present disclosure, in the case that the semiconductor package 100 contains additional patterned conductive layers over the third patterned conductive layer 132, successively-formed via holes would taper in the same direction as the first via holes 11o and the third via holes 13o, while the second via holes 12o taper in an opposite direction.

Figure 3:
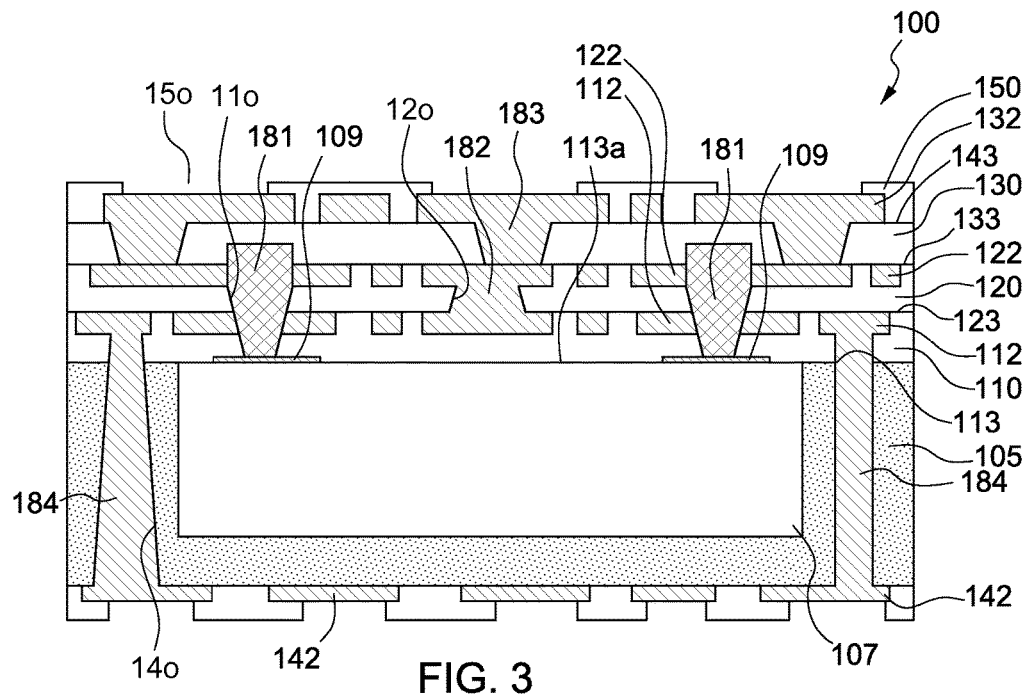
FIG. 3 illustrates a cross-sectional view of a semiconductor package in accordance with a further embodiment of the present disclosure.
Figure 4:
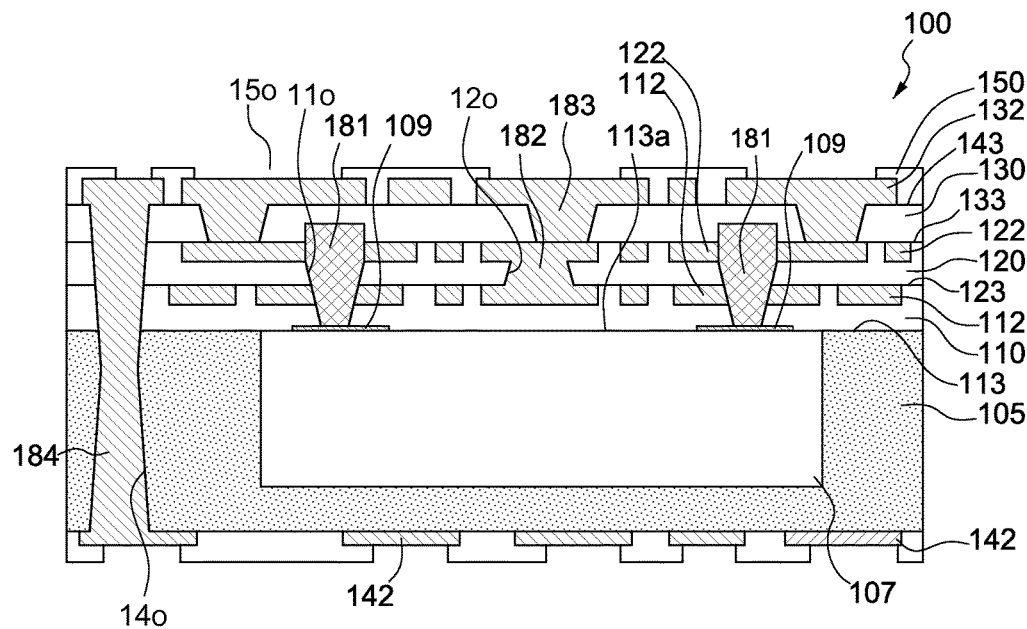
FIG. 4 illustrates a cross-sectional view of a semiconductor package in accordance with a further embodiment of the present disclosure.

FIGS. 3 and 4 illustrates a cross-sectional view of the semiconductor package 100 of FIG. 1 with additional layers, in accordance with two embodiments of the present disclosure.

As shown in FIGS. 3 and 4, the semiconductor package 100 further includes a fourth patterned conductive layer 142. The fourth patterned conductive layer 142 is disposed on the encapsulation layer 105 on a surface of the encapsulation layer 105 facing away from the surface 113 of the encapsulation layer 105.

In FIG. 3, fourth via holes 14o extend from the fourth patterned conductive layer 142 to the first patterned conductive layer 112. The fourth via holes 14o may have different shapes depending on the process conditions or parameters of a patterning process. The fourth via holes 14o may be formed, for example, by laser drilling, and may have a taper as shown in FIG. 3. The fourth via holes 14o are filled with fourth conductive members (or vias) 184. In this embodiment, the first patterned conductive layer 112 may electrically connect external circuits or other electric devices (e.g., passive elements) through fourth conductive members 184 and the fourth patterned conductive layer 142.

Although FIG. 3 illustrates a semiconductor package 100 including three patterned conductive layers (i.e., layers 112, 122 and 132), it should be noted that similar designs can be applied to semiconductor packages 100 including two patterned conductive layers (i.e., layers 112 and 122; as shown in FIG. 1), and can also be applied to semiconductor packages 100 including more than three patterned conductive layers. The fourth via holes 14o may extend from the fourth patterned conductive layer 142 on one side of the encapsulation layer 105 to any other patterned conductive layer disposed within semiconductor package 100 and on or beyond the surface 113 of the encapsulation layer 105.

In FIG. 4, the fourth via holes 14o are defined by the encapsulation layer 105, the first dielectric layer 110, the second dielectric layer 120, and the third dielectric layer 130, and extend from the fourth patterned conductive layer 142 to the third patterned conductive layer 132. A shape of the fourth via holes 14o can be controlled by adjusting process conditions or parameters of a patterning process (such as, for example, laser drilling). In the embodiment illustrated in FIG. 4, the fourth via hole 14o tapers from one side of the fourth via hole 14o to a middle part of the fourth via hole 14o, and tapers in an opposite direction from the other side of the fourth via hole 14o to the middle part of the fourth via hole 14o (e.g., the fourth via hole 14o resembles the shape of an hourglass) In an embodiment, the middle part of the fourth via hole 14o is positioned close to (e.g., substantially coplanar with) a center plane of the semiconductor package 100, so that a diameter of the middle part can be maximized. As such a minimum cross-section area of the fourth via hole 14o may be maximized, thereby enhancing the conductivity of the fourth conductive member 184 filled in the fourth via hole 14o.

Similar to the case in FIG. 3, although FIG. 4 illustrates a semiconductor package 100 including three patterned conductive layers (i.e., layers 112, 122 and 132), it should be noted that similar design can be applied to the semiconductor package 100 including two patterned conductive layers (i.e., layers 112 and 122; as shown in FIG. 1) and can also be applied to a semiconductor package 100 including more than three patterned conductive layers. In general, the fourth via holes 14o may extend from the fourth patterned conductive layer 142 on one side of the encapsulation layer 105 to the outermost patterned conductive layers disposed within semiconductor package 100 and on or beyond the surface 113 of the encapsulation layer 105; further, the middle part (e.g., the narrowest part of the hourglass shape) of the fourth via hole 14o may correspondingly be positioned anywhere along the fourth via hole 14o. Positioning of the middle part of the fourth via hole 14o near a center plane of the semiconductor package 100 maximizes the minimum cross-section area of the fourth via hole 14o, as described above.

The fourth conductive members 184 disposed in the fourth via holes 14o allow other electronic devices, such as passive components, or a second semiconductor substrate, to be mounted or attached to the other side of the encapsulation layer. This results in more flexible circuit design, and may result in reduced warpage of the semiconductor package 100.

In an embodiment, the present disclosure provides a method of making a semiconductor package including: (a) providing a carrier having an upper surface; (b) forming a first patterned conductive layer on the upper surface of the carrier; (c) forming a first dielectric layer encapsulating the first patterned conductive layer, wherein the first dielectric layer has a first surface facing away from the upper surface of the carrier; (d) forming a second patterned conductive layer on the first surface of the first dielectric layer; (e) forming a second dielectric layer encapsulating the second patterned conductive layer, wherein the second dielectric layer has a second surface facing away from the first surface of the first dielectric layer; (f) attaching a die comprising pads to the second surface of the second dielectric layer; (g) forming an encapsulation layer encapsulating the die; (h) removing the carrier; (i) forming first conductive via holes penetrating the first dielectric layer and the second dielectric layer; and (j) forming, in the first conductive via holes, conductive members electrically connecting the pads to one or both of the first patterned conductive layer and the second patterned conductive layer.

In another embodiment of the present disclosure, forming first conductive via holes includes using a portion of the first patterned conductive layer and a portion of the second patterned conductive layer to guide the formation of the first conductive via holes.

In another embodiment of the present disclosure, before attaching the die, performing a quality test on the first and second patterned conductive layers.

In another embodiment of the present disclosure, attaching the die includes pressing the pads of the die into the second dielectric layer, and subsequently curing the second dielectric layer such that the second dielectric layer is solidified.

FIGS. 5A to 5M illustrate a method of making a semiconductor package containing two patterned conductive layers in accordance with an embodiment of the present disclosure.

Figure 5A:
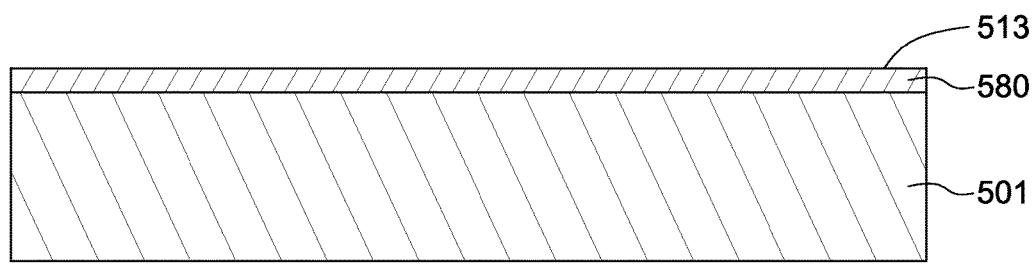
FIGS. 5A, 5B, 5C, 5D, 5E, 5F, 5G, 5H, 5I, 5J, 5K, 5L, and 5M illustrate a method of making a semiconductor package in accordance with an embodiment of the present disclosure.

In FIG. 5A, a carrier 501 having an upper surface 513 is provided. The carrier 501 may be, but is not limited to, a silicon, plastic or metal panel. In an embodiment of the present disclosure, the upper surface 513 of the carrier 501 includes an optional metal layer 580 as a seed layer so as to facilitate subsequent processes. The metal layer 580 may be, but is not limited to, a relatively thin copper sheet or copper foil, and may have a thickness of, for example, approximately 2 µm.

Figure 5B:
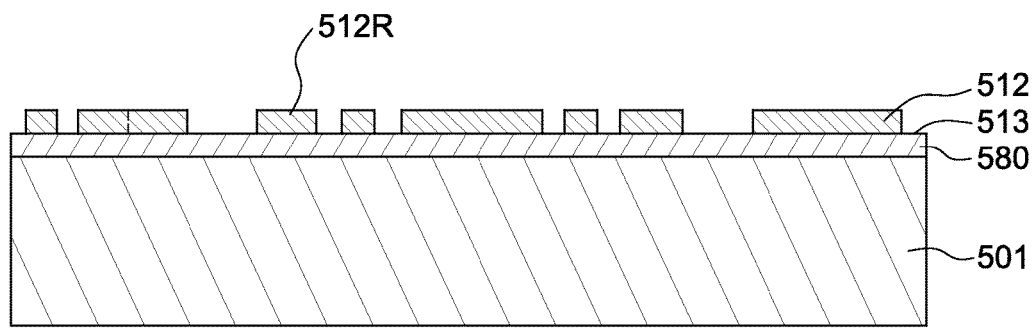

In FIG. 5B, a first patterned conductive layer 512 is formed on the upper surface 513 of the carrier 501. The first patterned conductive layer 512 may be formed, for example, by photo-lithography and plating technology. The first patterned conductive layer 512 includes ring-shaped portions 512R, and the openings of the ring-shaped portions 512R define the shape and location of via holes formed in a subsequent process.

Figure 5C:
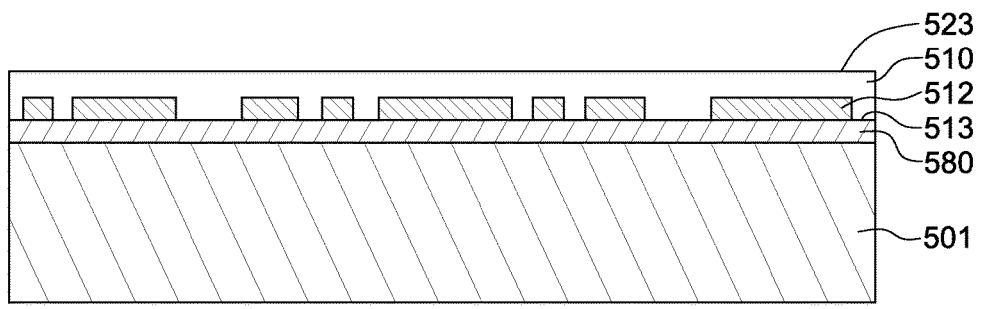

In FIG. 5C, a first dielectric layer 510 is formed on the upper surface 513 of the carrier 501 and the first patterned conductive layer 512. The first dielectric layer 510 encapsulates the first patterned conductive layer 512, and has a surface 523 facing away from the upper surface 513 of the carrier 501. The first dielectric layer 510 may be formed, for example, by laminating a dielectric material to the upper surface 513 of the carrier 501.

Figure 5D:
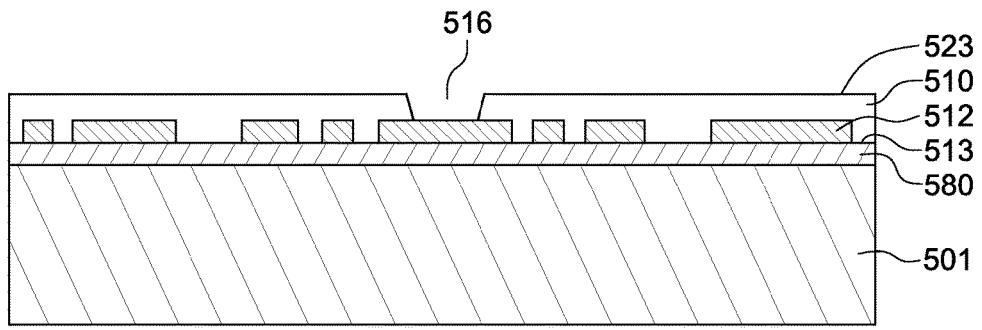

In FIG. 5D, a blind via hole 516 penetrating the first dielectric layer 510 to the first patterned conductive layer 512 is formed, for example, by laser drilling. A portion of the first patterned conductive layer 512 is exposed from the via hole 516.

Figure 5E:
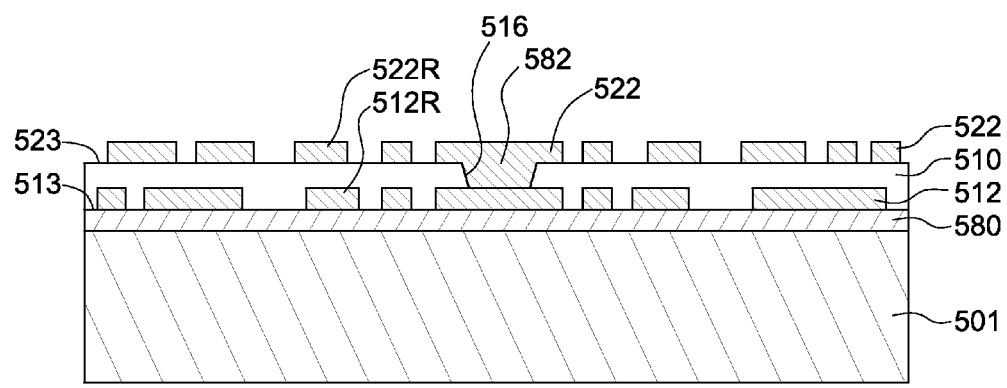

In FIG. 5E, a second patterned conductive layer 522 is formed on the surface 523 of the first dielectric layer 510, and a conductive material fills in the blind via holes 516 to form blind vias 582 (e.g., such as the second conductive members 182 of the semiconductor package 100). The material of the second patterned conductive layer 522 and the blind vias 582 may be, but is not limited to, copper or other metal, or a metal alloy. The second patterned conductive layer 522 and the blind vias 582 may be formed integrally, such as, for example, by photo-lithography and plating technology. The second patterned conductive layer 522 includes ring-shaped portions 522R, and the openings of the ring-shaped portions 522R define the shape and location of via holes formed in a subsequent process. Inner diameters of the ring-shaped portions 522R are smaller than inner diameters of the ring-shaped portions 512R. Each opening of the ring-shaped portions 522R is aligned with a respective opening of the ring-shaped portions 512R.

Figure 5F:
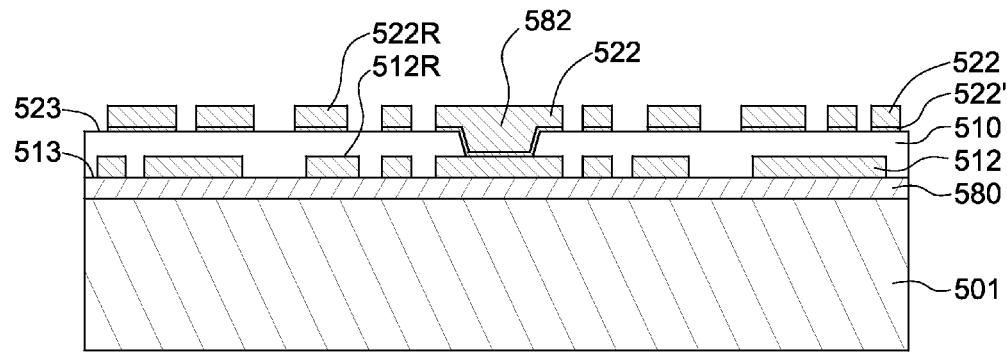

As shown in FIG. 5F, a seed layer 522' may be pre-formed on the surface 523 of the first dielectric layer 510, and along a side wall and a bottom of each of the blind via holes 516, so as to facilitate the formation of the second patterned conductive layer 522 and the blind vias 582. The material of the seed layer may be, but is not limited to, electroless deposited copper, titanium copper (TiCu), or other suitable metal or metal alloy. The seed layer 522' may be patterned together with the second patterned conductive layer 522. In an embodiment, the patterned seed layer 522' can be viewed as a part of the second patterned conductive layer 522 and as a part of the blind vias 582.

According to the present disclosure, a quality test can be performed on the first patterned conductive layer 512 and the second patterned conductive layer 522, before fabricating other structures on the first or second patterned conductive layers 512 and 522, respectively. For example, after the formation of the first patterned conductive layer 512, an automated optical inspection (AOI) or other inspection technique may be used to identify defects in the first patterned conductive layer 512, to screen out a device with defects. A similar test may be performed on the second patterned conductive layer 522. Since no further process (e.g., die attachment) would be performed for a particular device with defects, the manufacturing cost can be reduced, and the overall yield rate can be improved.

Figure 5G:
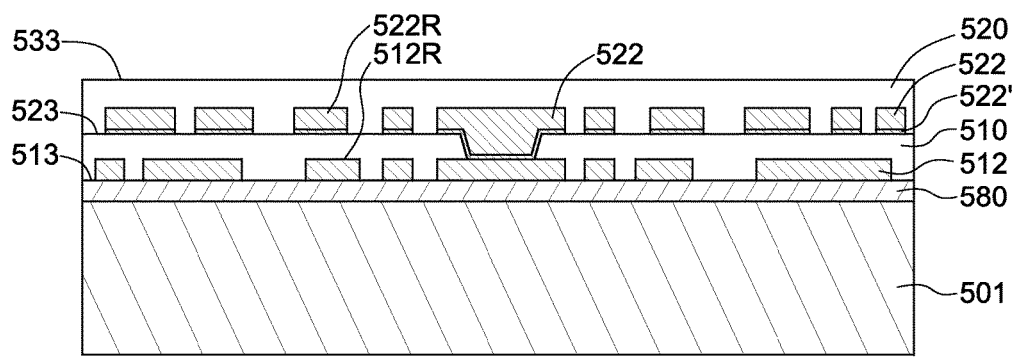

In FIG. 5G, a second dielectric layer 520 is formed on the surface 523 of the first dielectric layer 510. The second dielectric layer 520 has a surface 533 facing away from the surface 523 of the first dielectric layer 510. The second dielectric layer 520 may be formed, for example, by laminating a dielectric material (e.g., a B-stage epoxy resin or pre-preg) to the surface 523 of the first dielectric layer 510 and the second patterned conductive layer 522.

Figure 5H:
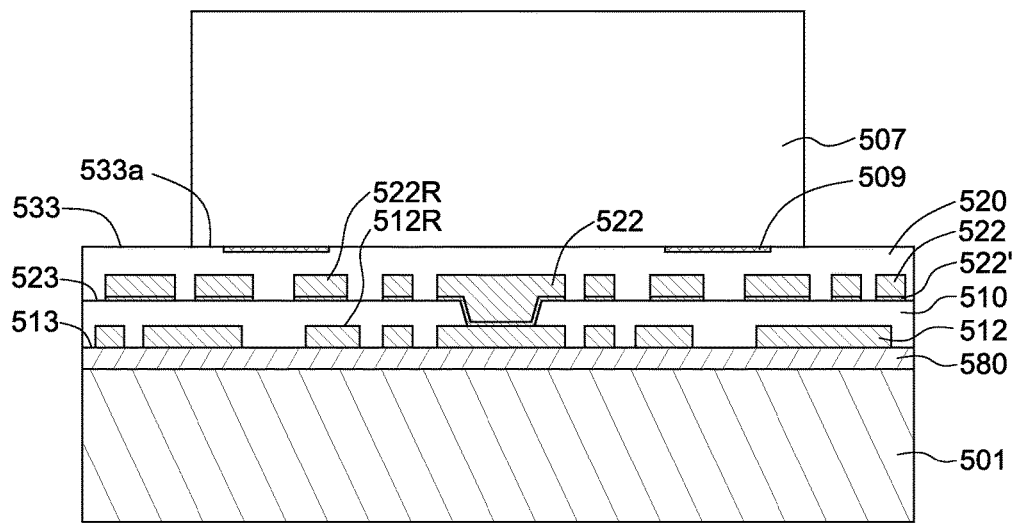

In FIG. 5H, a component 507 (e.g., a die) including pads 509 on a front surface 533a is attached to the surface 533 of the second dielectric layer 520. A central portion of a pad 509 is aligned with a respective opening of a ring-shaped portion 522R. The front surface 533a of the component 507 faces and contacts the surface 533 of the second dielectric layer 520. In an embodiment, the second dielectric layer 520 includes a B-stage epoxy resin (subsequently cured) such that the pads 509 can be pressed into the second dielectric layer 520, and the front surface 533a of the component 507 is substantially coplanar with the surface 533 of the second dielectric layer 520. After the attachment of the component 507, one or both (as applicable) of the first dielectric layer 510 and the second dielectric layer 520 may be cured, for example, by heat. Because the second dielectric layer 520 is cured, the component 507 can be well fixed on the second dielectric layer 520, reducing the possibility of movement of the component 507 during the remainder of the packaging.

Figure 5I:
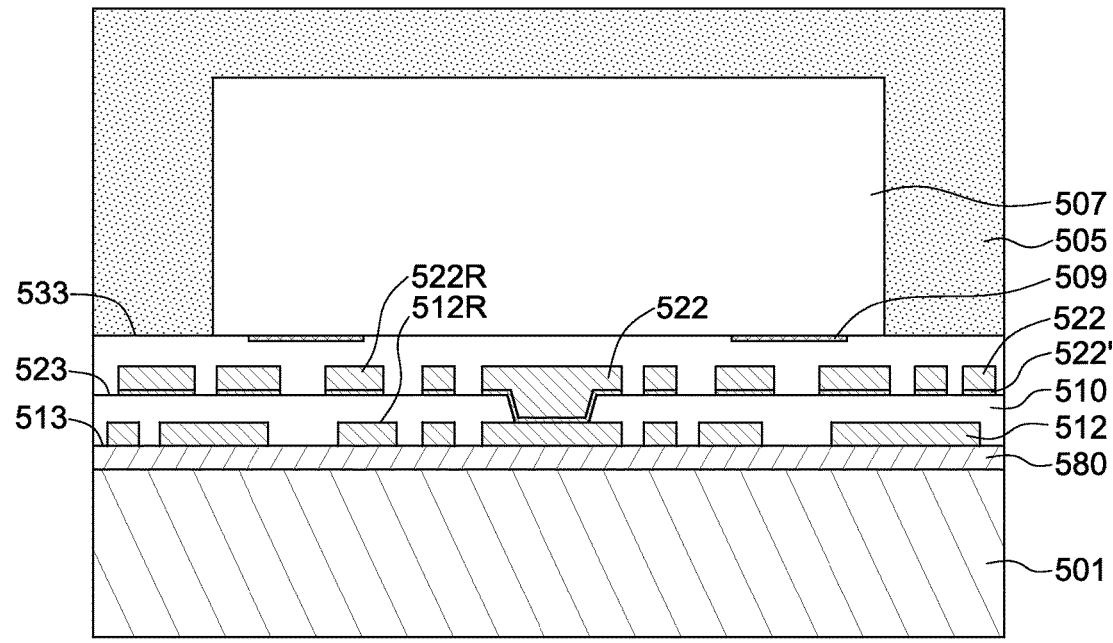

In FIG. 5I, an encapsulation layer 505 is formed, encapsulating the component 507. A technique for forming the encapsulation layer 505 may be, but is not limited to, a molding technology which uses a molding compound with the help of mold chase (not shown) to encapsulate the component 507. In another embodiment of the present disclosure, sheets made from pre-preg may be stacked or laminated to the second dielectric layer 520 and the component 507 to form the encapsulation layer 505.

Figure 5J:
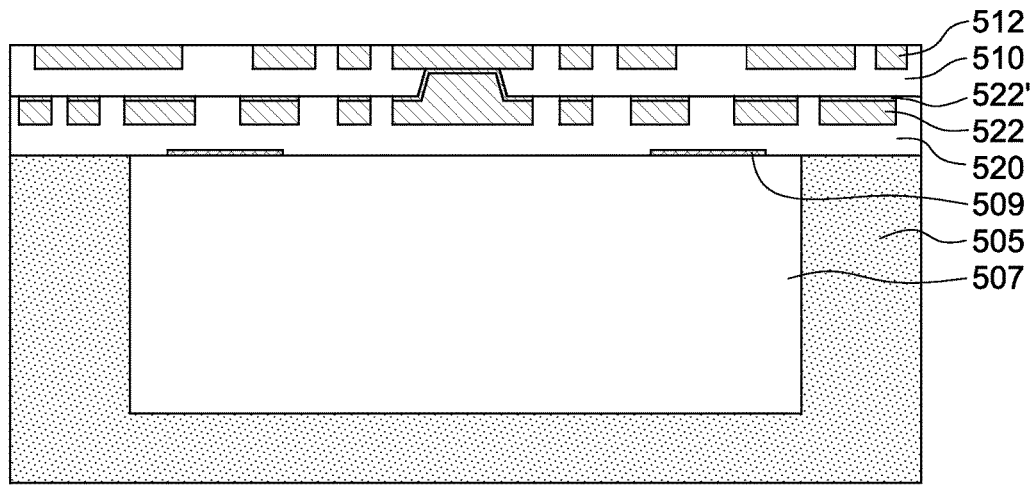

In FIG. 5J, the carrier 501 is detached, and the metal layer 580, if present, is subsequently removed, for example, by etching.

Figure 5K:
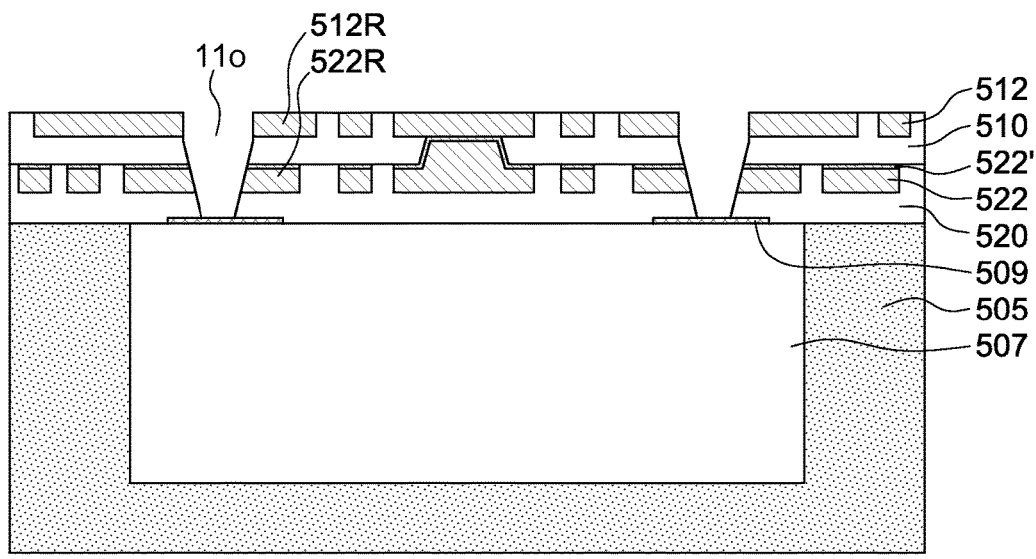
Figure 5L:
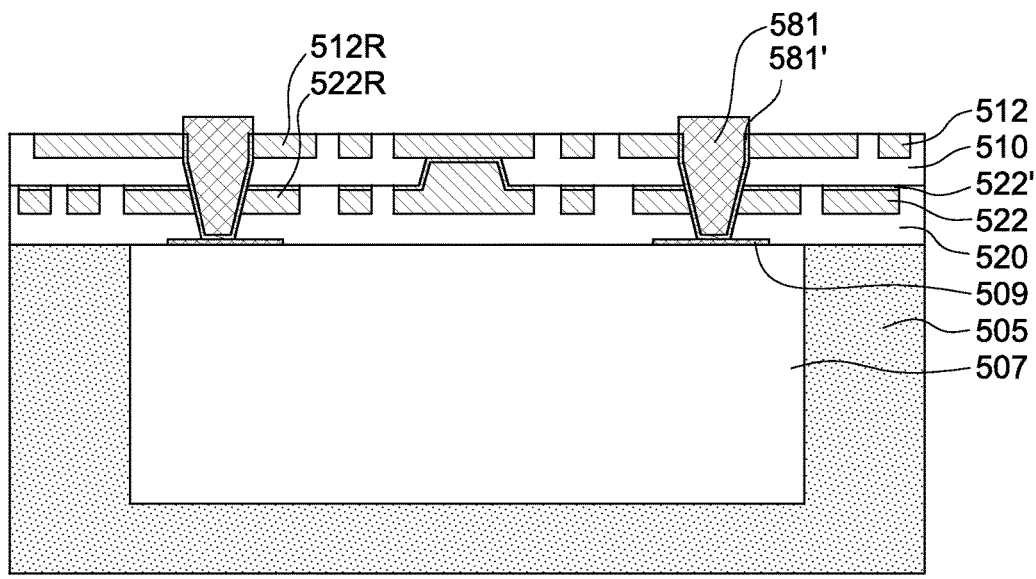

In FIGS. 5K and 5L, first conductive vias 581 penetrating the first and second dielectric layers 510 and 520 are formed. The first conductive vias 581 electrically connect the pads 509 to one or both of the first patterned conductive layer 512 and the second patterned conductive layer 522. In an embodiment of the present disclosure, at least a portion of the first patterned conductive layer 512 and at least a portion of the second patterned conductive layer 522 are used to define via holes for formation of the first conductive vias 581.

In FIG. 5K, a number of via holes 110 are formed in the first and second dielectric layers 510 and 520 so as to expose the pads 509. The ring-shaped portions 512R of the first patterned conductive layer 512 and the ring-shaped portions 522R of the second patterned conductive layer 522 can be used as a mask to facilitate the formation of the via holes 11o. For example, the inner rims of the ring-shaped portions 512R and 522R may help guide a laser drill equipment to more precisely remove the respective first dielectric layer 510 and the second dielectric layer 520 surrounded thereby.

As shown for the embodiment of FIG. 5K, the via holes 11o are formed following the removal of carrier 501 and optional metal layer 580 (FIG. 5I). In another embodiment, via holes 110 are formed prior to the placement of the component 507 (FIG. 5H). The component 507 is then positioned on the surface 533 of the second dielectric layer 520 in a manner such that that the pads 509 are aligned with the via holes 110. After the attachment of the component 507, an encapsulation layer 505 is applied as shown in FIG. 5I; the carrier 501 and the metal layer 580 (if present) are removed as shown in FIG. 5J; and a structure similar to that shown in FIG. 5K is obtained. It should be noted that although this embodiment illustrates the preparation of a package containing two patterned conductive layers (i.e., 512 and 522), a package containing a single patterned conductive layer can be made in accordance with the concepts of this disclosure.

In FIG. 5L, the first conductive vias 581 are formed, for example, by sputtering a seed layer 581' (such as TiCu) along the side wall and on the bottom of the via holes 11o, and then filling the via holes 11o with a conductive material, such as copper, nickel or solder; for example, by using a plating technology. In another embodiment, the via holes 110 can be filled with a conductive paste by a printing technology without forming a seed layer. The first conductive vias 581 may protrude from the first dielectric layer 510 and the first patterned conductive layer 512 to ensure a good connection between the first conductive vias 581 and the inner rims of the ring-shaped portions 512R.

Figure 5M:
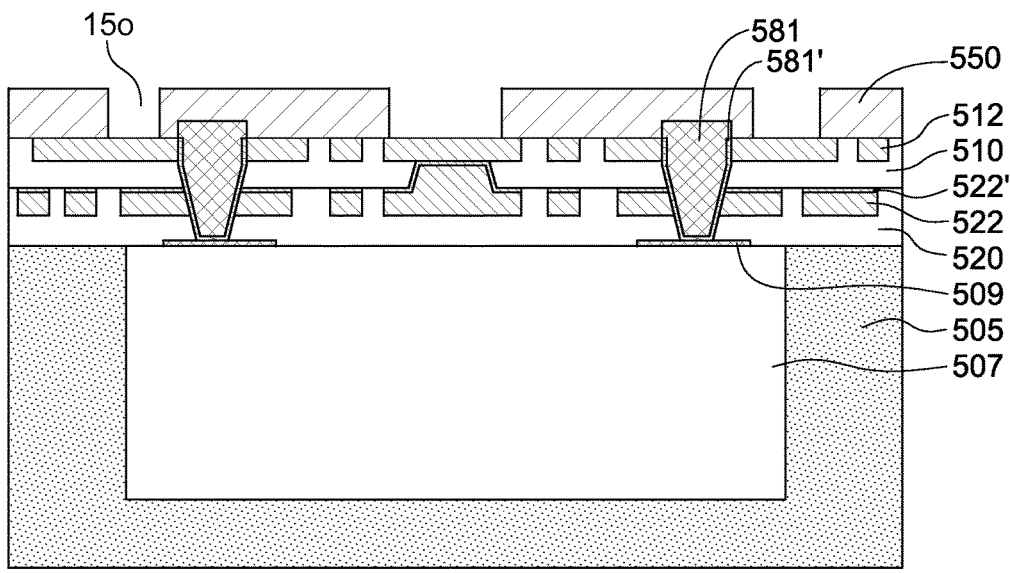

In FIG. 5M, a protection layer 550, such as a solder resist layer, is disposed on the first dielectric layer 510 and the first patterned conductive layer 512. The protection layer 550 has openings 15o exposing a portion of the first patterned conductive layer 512. The protection layer 550 is prepared by coating a resin of a solder resist layer, or by laminating a solder resist layer to the first dielectric layer 510 and the first patterned conductive layer 512, and then forming openings 15o by photolithography technology, such as exposure and developing.

A method of making semiconductor package containing three patterned conductive layers in accordance with an embodiment of the present disclosure is further illustrated. In this embodiment, a semiconductor package containing two patterned conductive layers is first prepared according to the illustrations in FIGS. 5A to 5L, and then a third patterned conductive layer and a solder resist layer with openings are formed as shown in FIGS. 5N to 5P.

Figure 5N:
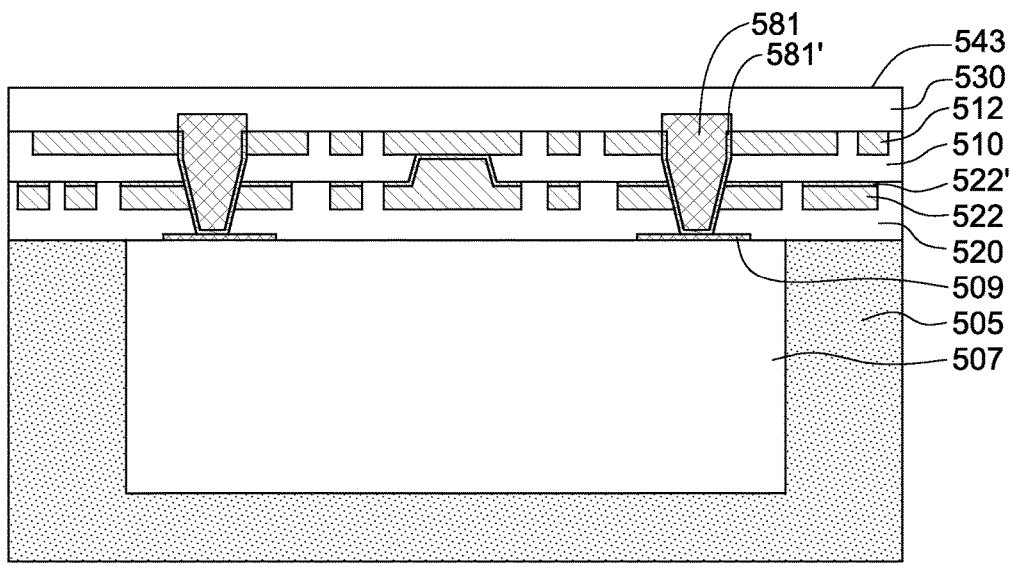
FIGS. 5N, 5O, 5P illustrate a method of making a semiconductor package in accordance with another embodiment of the present disclosure.

In FIG. 5N, a third dielectric layer 530 is formed on the first dielectric layer 510 and the first patterned conductive layer 512. The third dielectric layer 530 may be formed, for example, by laminating a dielectric material to the first dielectric layer 510 and the second patterned conductive layer 522.

Figure 5O:
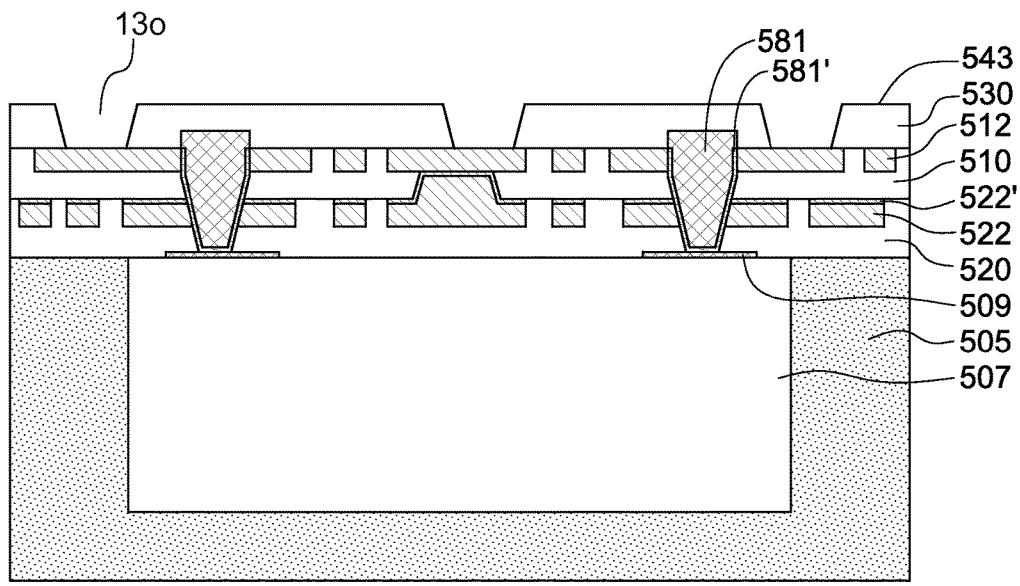

In FIG. 5O, a number of via holes 13o are formed in the third dielectric layer 530 by patterning technology, such as by etching or laser drilling, so as to expose a portion of the first patterned conductive layer 512.

Figure 5P:
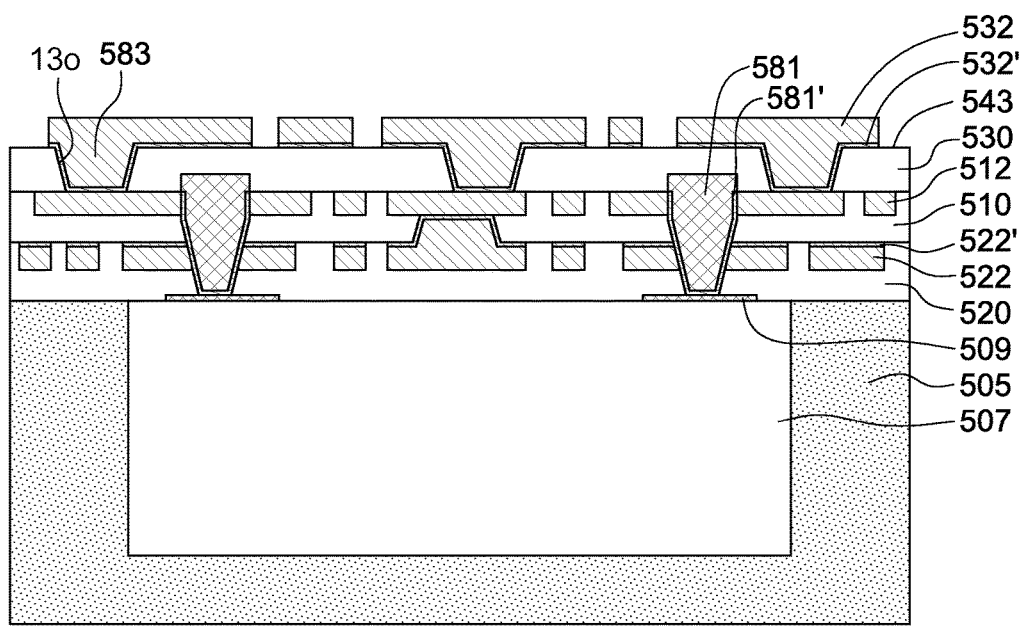

In FIG. 5P, a third patterned conductive layer 532 is formed on the third dielectric layer 530, and third conductive vias 583 are formed by filling conductive material in the via holes 13o. In an embodiment, a seed layer 532' may be pre-formed on the third dielectric layer 530, and along the side wall and the bottom of each of the via holes 13o, so as to facilitate the formation of third patterned conductive layer 532 and third conductive vias 583. The seed layer 532' may be patterned together with the third patterned conductive layer. In an embodiment, the patterned seed layer 532' can be viewed as a part of the third patterned conductive layer 532 and as a part of the third conductive vias 583. The material and method for fabricating the third patterned conductive layer 532 and the third conductive vias 583 are similar to those for fabricating the second patterned conductive layer 522 and the blind vias 582. The third conductive vias 583 penetrate the third dielectric layer 530 and electrically connect to the first patterned conductive layer 512.

In an embodiment, a protection layer (not shown) may be further disposed on the third dielectric layer 530 and the third patterned conductive layer 532, with openings exposing a portion of the third patterned conductive layer 532. The material and method for fabricating the protection layer are similar to those disclosed above and illustrated in FIG. 5M.

Figure 6:
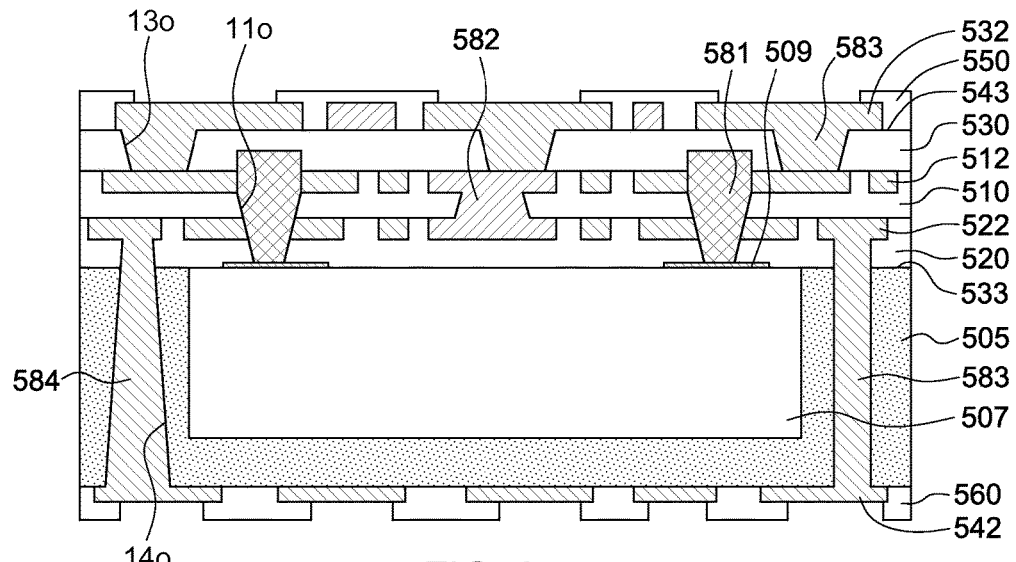
FIG. 6 illustrates a method of making a semiconductor package in accordance with an embodiment of the present disclosure.

FIG. 6 illustrates the formation of fourth conductive vias 584 in via holes 14o and a fourth patterned conductive layer 542 on the encapsulation layer 505. The encapsulation layer 505 defines fourth via holes 14o extending from the fourth patterned conductive layer 542 to the second patterned conductive layer 522. The via holes 14o may be formed, for example, by laser drilling. The formation of at least portions of the via holes 14o may be performed in a common processing operation along with the formation of the via holes 110 or the formation of the via holes 13o, or may be performed after the fabrication of the third patterned conductive layer 532. The fourth conductive patterned layer 542 and the fourth conductive vias 584 may be formed concurrently by applying a conductive material on the encapsulation layer 505 and in the via holes 14o. Similarly, a seed layer (not shown) may be used to facilitate the formation of the fourth conductive patterned layer 542 and the fourth conductive vias 584. Finally, a patterned protection layer 560 is disposed on the encapsulation layer 505 and the fourth conductive patterned layer 542.

Figure 7:
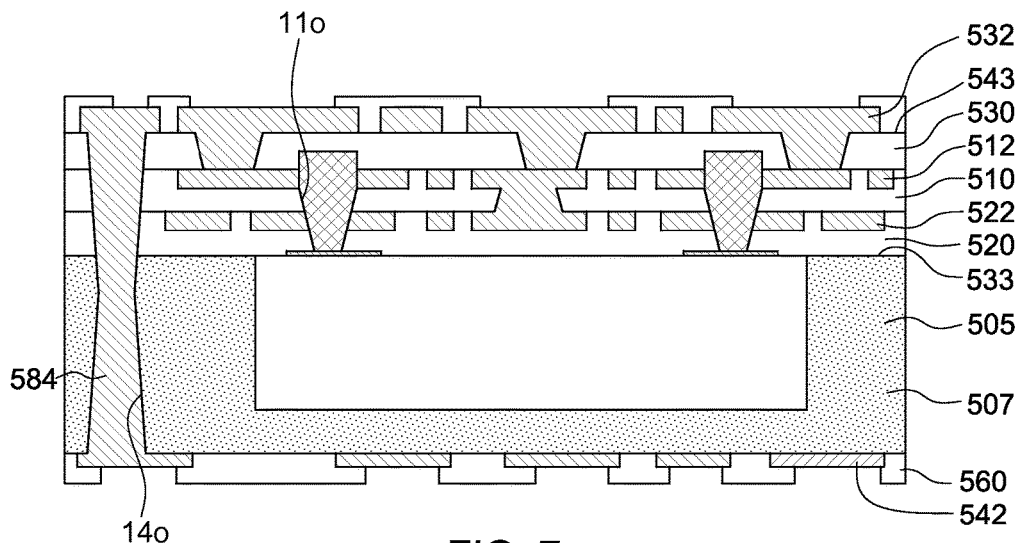
FIG. 7 illustrates a method of making conductive vias in accordance with an embodiment of the present disclosure.

FIG. 7 illustrates the formation of conductive vias 584 having a shape similar to an hourglass in via holes 14o in accordance with an embodiment of the present disclosure. The via holes 14o may be formed in corresponding hourglass shape, for example, by conducting laser drilling at the outermost dielectric layers at the top and bottom of the semiconductor package concurrently or sequentially. Then the via holes 14o are filled with a conductive material as disclosed above and the hourglass-shaped conductive vias 584 are formed. Finally, a patterned protection layer 560 is disposed on the encapsulation layer 505 and the fourth conductive patterned layer 542.

As used herein and not otherwise defined, the terms "substantially" and "about" are used to describe and account for small variations. When used in conjunction with an event or circumstance (e.g., "substantially concurrently"), the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. Two surfaces can be deemed to be coplanar or substantially coplanar if a displacement between the two surfaces is no greater than 1 μm, no greater than 5 μm, no greater than 10 μm, or no greater than 15 μm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale.

There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosur.

What is claimed is:

1. A semiconductor package, comprising:
    an encapsulation layer having a first surface;
    a component within the encapsulation layer, the component having a front surface and comprising a plurality of pads on the front surface, the front surface of the component being substantially coplanar with the first surface of the encapsulation layer;
    a first dielectric layer on the first surface of the encapsulation layer, the first dielectric layer having a second surface facing away from the first surface of the encapsulation layer;
    a second dielectric layer on the second surface of the first dielectric layer, the second dielectric layer having a third surface facing away from the second surface of the first dielectric layer;
    a first patterned conductive layer within the first dielectric layer;
    a second patterned conductive layer within the second dielectric layer; and
    the first patterned conductive layer, the second patterned conductive layer, the first dielectric layer and the second dielectric layer defining a plurality of first via holes extending from the third surface of the second dielectric layer to respective ones of the pads, wherein each of the first via holes penetrates the first patterned conductive layer, the second patterned conductive layer, the first dielectric layer and the second dielectric layer.

2. The semiconductor package of claim 1, wherein each of first via holes is surrounded by a ring-shaped portion of the first patterned conductive layer and a ring-shaped portion of the second patterned conductive layer.

3. The semiconductor package of claim 2, wherein an inner diameter of the ring-shaped portion of the first patterned conductive layer is smaller than an inner diameter of the ring-shaped portion of the second patterned conductive layer.

4. The semiconductor package of claim 1, wherein the second dielectric layer further defines a plurality of second via holes extending from the second patterned conductive layer to the first patterned conductive layer.

5. The semiconductor package of claim 4, wherein the first via holes and the second via holes are each tapered, and the first via holes taper and the second via holes taper in opposite directions.

6. The semiconductor package of claim 1, further comprising a plurality of conductive members filling the first via holes.

7. The semiconductor package of claim 6, wherein the conductive members are formed of solder.

8. The semiconductor package of claim 6, wherein the conductive members protrude from the third surface of the second dielectric layer.

9. A semiconductor package, comprising:
    a die comprising a die body and a plurality of pads, the die body having a front surface on which the pads are disposed;
    an encapsulation layer having a first surface, the encapsulation layer encapsulating the die body while exposing the front surface of the die body from the first surface of the encapsulation layer, the front surface of the die being substantially coplanar with the first surface of the encapsulation layer;
    a first dielectric layer disposed on the first surface of the encapsulation layer and over the pads and exposing portions of the pads, wherein the first dielectric layer has a second surface facing away from the first surface of the encapsulation layer;
    a second dielectric layer disposed on the second surface of the first dielectric layer and exposing the portions of the pads, wherein the second dielectric layer has a third surface facing away from the second surface of the first dielectric layer;
    a plurality of first conductive members, each of the first conductive members penetrating the first and second dielectric layers and electrically connected to a respective exposed portion of one of the pads;
    a first patterned conductive layer completely embedded in the first dielectric layer and spaced from the front surface of the die body; and
    a second patterned conductive layer embedded in the second dielectric layer,
    wherein the first and second patterned conductive layers are electrically connected to and in contact with the first conductive members.

10. The semiconductor package of claim 9, further comprising a plurality of second conductive members, each of the second conductive members penetrating the second dielectric layer and electrically connecting the first patterned conductive layer to the second patterned conductive layer.

11. The semiconductor package of claim 10, wherein the first conductive members and second conductive members are each tapered, and the first conductive members taper in an opposite direction to the second conductive members.

12. The semiconductor package of claim 9, wherein the first patterned conductive layer includes a plurality of first conductive rings, and the second patterned conductive layer includes a plurality of second conductive rings, and wherein each of the first conductive members is surrounded by a respective one of the first conductive rings and a respective one of the second conductive rings.

13. The semiconductor package of claim 12, wherein each of the first conductive rings has an inner diameter equal to or smaller than an inner diameter of a respective one of the second conductive rings.

14. A semiconductor package, comprising:
    a die comprising a die body and a plurality of pads, the die body having a front surface on which the pads are disposed;
    an encapsulation layer having a first surface, the encapsulation layer encapsulating the die body while exposing the front surface of the die body from the first surface of the encapsulation layer;
    a first dielectric layer disposed on the first surface of the encapsulation layer and covering the pads, wherein the first dielectric layer has a second surface facing away from the first surface of the encapsulation layer;

a second dielectric layer disposed on the second surface of the first dielectric layer, wherein the second dielectric layer has a third surface facing away from the second surface of the first dielectric layer;

a plurality of first conductive members, each of the first conductive members penetrating the first and second dielectric layers and electrically connected to a respective one of the pads;

a first patterned conductive layer embedded in the first dielectric layer and extending laterally in the first dielectric layer, the first patterned conductive layer having a surface being substantially coplanar with the second surface of the first dielectric layer; and a second patterned conductive layer embedded in the second dielectric layer, wherein the first and second patterned conductive layers are electrically connected to the first conductive members, the first patterned conductive layer does not protrude from the second surface of the first dielectric layer, and the second patterned conductive layer does not protrude from the third surface of the second dielectric layer.

15. The semiconductor package of claim 14, further comprising a plurality of second conductive members, each of the second conductive members penetrating the second dielectric layer and electrically connecting the first patterned conductive layer to the second patterned conductive layer.

16. The semiconductor package of claim 15, wherein the first conductive members and second conductive members are each tapered, and the first conductive members taper in an opposite direction to the second conductive members.

* * * * *